(12) United States Patent
Noda

(10) Patent No.: US 6,212,124 B1
(45) Date of Patent: Apr. 3, 2001

(54) STATIC RAM HAVING WORD LINE DRIVING CIRCUITRY SHARED BY ALL THE MEMORY CELLS PROVIDED THEREIN

(75) Inventor: Kenji Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/499,953

(22) Filed: Feb. 8, 2000

(30) Foreign Application Priority Data

Feb. 9, 1999 (JP) .................................................. 11-030824
May 25, 1999 (JP) .................................................. 11-144604

(51) Int. Cl.$^7$ ..................................................... G11C 8/00
(52) U.S. Cl. ................. 365/230.6; 365/188; 365/189.07; 365/189.08
(58) Field of Search ............................... 365/230.06, 188, 365/189.07, 189.08

(56) References Cited

U.S. PATENT DOCUMENTS

| | | | |
|---|---|---|---|
| 4,798,977 | * | 1/1989 | Sakui et al. ............................ 307/446 |
| 5,212,663 | * | 5/1993 | Leong .............................. 365/189.01 |
| 5,673,230 | * | 9/1997 | Kuriyama .............................. 365/203 |
| 5,781,497 | * | 7/1998 | Patel et al. ....................... 365/230.06 |

* cited by examiner

Primary Examiner—Richard Elms
Assistant Examiner—Tuan T. Nguyen
(74) Attorney, Agent, or Firm—Hutchins, Wheeler & Dittmar (57) ABSTRACT

A static RAM which features an inclusion of a word line driving circuit shared by all the memory cells in the static RAM is disclosed. The static RAM is comprised of a plurality of four-transistor memory cells arranged in an array. Each of the memory cells includes first and second FETs respectively coupled to bit lines and controlled by word line potential. Further, each of the memory cells further comprises third and fourth cross-coupled FETs respectively coupled in series with the first and second FETs and forming a circuit having two stable states. The word line driving circuit reflects a stable state potential change of each of the plurality of memory cells, and controls an output voltage thereof which is applied to the plurality of memory cells in order to maintain the stable state potential in each of the plurality of memory cells.

17 Claims, 5 Drawing Sheets

STATIC RAM HAVING WORD LINE DRIVING CIRCUITRY SHARED BY ALL THE MEMORY CELLS PROVIDED THEREIN

BACKGROUND OF THE INVENTION

1. Field of the Invention

The present invention relates generally to a static RAM (random access memory) for use in digital computer systems. More specifically, the present invention relates to a static RAM which features an inclusion of improved word line driving circuitry which is shared by all the memory cells provided in the RAM. The memory cell comprises four MOSFETs (metal oxide semiconductor field effect transistors) which have no load.

2. Description of the Related Art

Memory cells used in digital information processing systems are generally classified into two types: one is dynamic memory cells and the other is static memory cells. The static memory is able to retain the binary data stored therein as long as power is applied thereto. That is, the static memory cell requires no overhead circuitry for periodical refresh as do the dynamic memory cell. Although the static RAM features high speed of memory access time, i.e., the time required to store and/or retrieve a particular bit(s) in the memory array, the area-efficiency of the memory array is poor relative to the dynamic RAM. That is, the number of stored data bits per unit area is one of the key design criteria that determine the overall storage capacity and hence the memory cost per bit. In order to improve the area-efficiency of a static RAM, a four-transistor having no load has been proposed as mentioned below.

Figure 1:
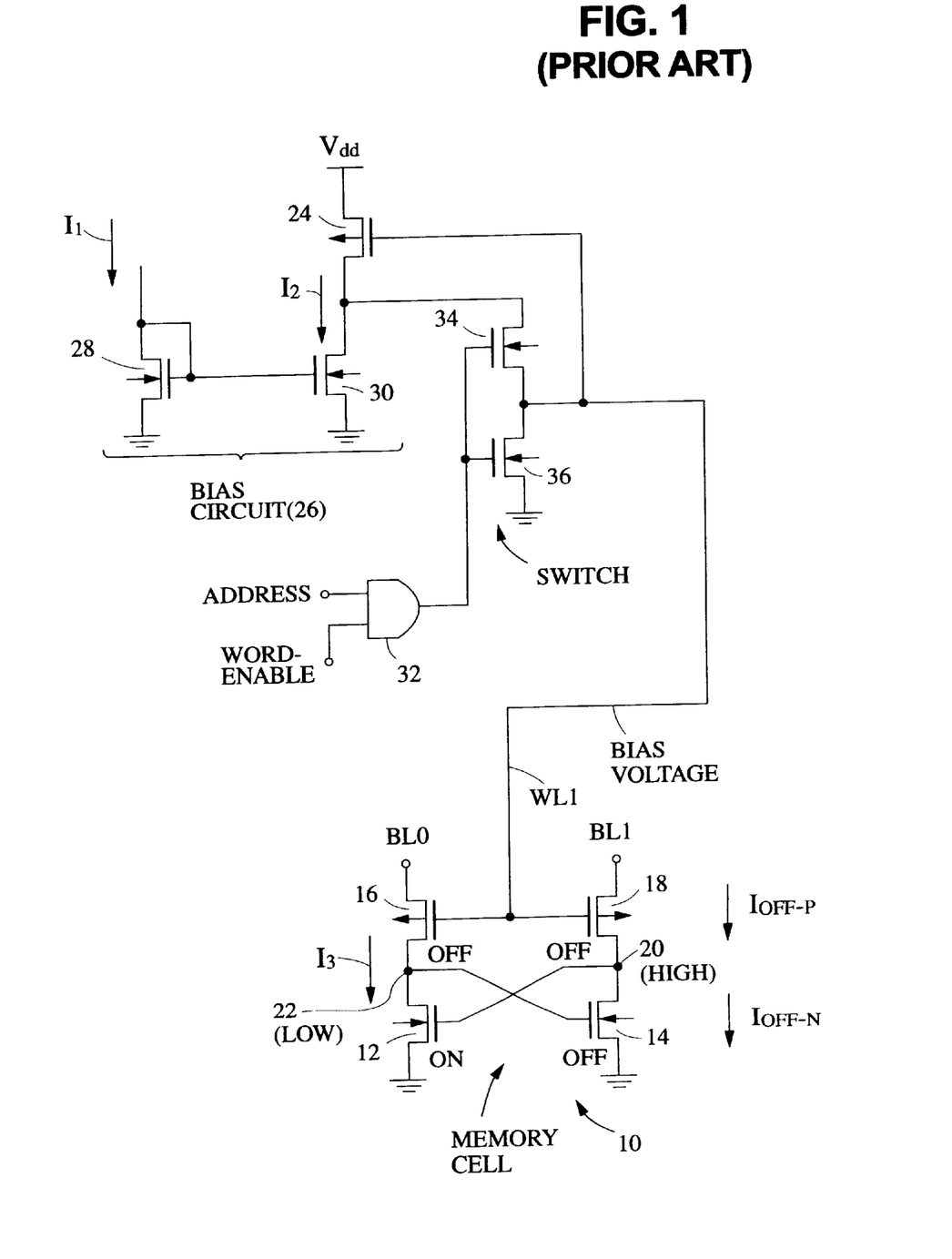
FIG. 1 is a diagram showing a conventional four-transistor memory cell together with the word line driving circuit, having been referred to in the opening paragraphs.

Before turning to the present invention, it is deemed advantageous to briefly describe conventional static RAMS with reference to FIG. 1, which is provided with four-transistor memory cells without any load and is disclosed in U.S. Pat. No. 4,796,227.

As shown in FIG. 1, a memory cell 10 includes a pair of cross-coupled transistors 12 and 14 comprising a circuit having two stable states. The selected state is retained by charge or potential on the gates of the transistors 12 and 14. The memory cell 10 further includes two bit line coupling transistors 16 and 18. The channel types of the transistors 12 and 14 are opposite to those of the transistors 16 and 18. That is, in the case where the transistors 12 and 14 are n-channel types as shown in FIG. 1, the transistors 16 and 18 are p-channel types and vice versa. The sources of the transistors 12 and 14 are grounded, and the drains thereof are respectively coupled to the drains of the transistors 16 and 18. The gates of the transistors 12 and 14 are respectively coupled to the drains of the transistors 14 and 12. On the other hand, the sources of the transistors 16 and 18 are respectively coupled to bit lines BL0 and BL1, and the gates thereof are both coupled to a word line WL1.

For the convenience of simplifying the descriptions, it is assumed that the memory cell 10 is in a standby mode (viz., the memory cell 10 is not being read or written). Further, assuming that the potentials at nodes 20 and 22 are respectively high and low, which indicates that the memory cell 10 stores one of two binary data (vis., logic "1" or "0"). In the standby mode, the potential on the bit lines BL0 and BL1 is at Vdd, and a bias voltage is applied to the word select line WL1. Under the above-mentioned assumption, only the transistor 12 is in a conducting state, and the other transistors 14, 16, and 18 are in non-conducting states. More specifically, the transistors 14, 16, and 18 are not in a fully non-conducting state, and a bias potential is applied to the word select line WL1 which is sufficient to cause small currents $I_3$ and $I_{OFF\text{-}P}$ to flow through the transistors 16 and 18, respectively. The small current $I_{OFF\text{-}P}$ is used to compensate for a leak current $I_{OFF\text{-}N}$ flowing through the transistor 14, which would otherwise result in a loss of charge (vis., high potential) at the node 20. In the above, since the transistor 12 is assumed to be conducting, the current $I_3$, flowing through the transistor 16, which in the ideal case, is equal to the current $I_{OFF\text{-}P}$, is wasted. However, the current $I_3$ is very small, the overall power dissipation of the memory cell 10 is not significantly effected.

On the contrary, if the potentials on the nodes 20 and 22 are respectively low and high, the memory cell 10 stores the other binary information. In this case, it is understood that the leak current flowing through the transistor 12 should be compensated for in the same manner as mentioned above.

The bias current $I_3$ is set with the aid of two "current mirror" circuits. The combination of transistors 24 and 16 forms a first current mirror circuit wherein the load current $I_3$ is proportional to a current $I_2$ in a bias circuit 26 times a geometric width ratio which is proportional to the ratio of the widths of the channels of the transistors 24 and 16. On the other hand, transistors 28 and 30 form a second current mirror circuit in which the current $I_2$ is proportional to a current $I_1$ applied from a constant current source (not shown) times a second geometric width ratio which is proportional to the ratio of the widths of the channels of the transistors 28 and 30. Accordingly, the current $I_{OFF\text{-}P}$, which is ideally equal to the current $I_3$, is able to maintain the potential on the node 20 by compensating for the leak current $I_{OFF\text{-}N}$.

During the standby mode, each of the bit lines BL0 and BL1 is at Vdd as mentioned above. Further, in this mode, there are no reading and writing operations, and AND gate 32 issues no coincidence signal in order that a transistor 34 is conducting and a transistor 36 is non-conducting. Accordingly, the bias voltage continues to be applied to the memory cell 10 by way of the word line WL1. The AND gate 32 and the transistors 34 and 36 form a switch.

To read the memory cell 10, the potential on the word line WL1 is lowered to ground in response to the change of on-and-off state of the transistors 34 and 36, which is caused by the coincidence issued from the AND gate 32. Accordingly, the transistors 16 and 18 are brought into conducting state, which exhibits a potential difference on the bit lines BL0 and BL1. This potential difference is detected using a sense amplifier (not shown) and hence, the binary data stored in the memory cell 10 is read.

On the other hand, to change the state of the memory cell 10 (viz., the transistors 12 and 14 are respectively turned off and on), the potential on the word the WL1 is lowered to ground as just mentioned above. Thereafter, a low signal is applied through the transistor 18 to turn off the transistor 12 whose gate is coupled to the node 20.

With the arrangement shown in FIG. 1, the constant current source (not shown) providing the current $I_1$ and its associated diode connected transistor 28 are shared by all of the memory cells. As a result, the prior art of FIG. 1 has encountered the problem that the peripheral circuitry of the memory cells undesirably occupies a considerable area on the chip. This is because the transistors 24, 30, 34, and 36 and the AND gate 32 should be provided for each of the word lines. In view of the ever-increasing demand for increase in the memory capacity of static RAM up to hundreds of thousands and more, it is highly preferable to reduce the area occupied by the peripheral circuitry of the memory cells. Further, the current is applied to the memory cell which comprises n-channel transistors 12, and 14 having large temperature-depending characteristics. Therefore, the large currents are inevitably needed when the memory chip is placed in high temperature environments because the current applied to each of the memory cells should be previously set to cover the condition of low ambient temperature.

SUMMARY OF THE INVENTION

It is therefore an object of the present to provide a static RAM featuring high area-efficiency, i.e., enabling it to increase the number of stored data bits per unit area in order to increase the overall storage capacity and hence to decrease the memory cost per bit.

Another object of the present invention is to provide a static RAM featuring low power consumption during the standby mode.

Still another object of the present invention is to provide improved word line driving circuitry for use in a static RAM, which is able to realize high area-efficiency thereby increasing the overall storage capacity and hence to decrease the memory cost per bit.

Still another object of the present invention is to provide improved word line driving circuitry for use in a static RAM, which enables low power dissipation during the standby mode.

In brief, these objects are achieved by a static RAM which features an inclusion of a word line driving circuit shared by all the memory cells in the static RAM is disclosed. The static RAM is comprised of a plurality of four-transistor memory cells arranged in an array. Each of the memory cells includes first and second FETs respectively coupled to bit lines and controlled by word line potential. Further, each of the memory cells further comprises third and fourth cross-coupled FETs respectively coupled in series with the first and second FETs and forming a circuit having two stable states. The word line driving circuit reflects a stable state potential change of each of the plurality of memory cells, and controls a voltage on a word line extending to the plurality of memory cells in order to maintain the stable state potential in each of the plurality of memory cells.

One aspect of the present invention resides in a state random access memory comprising: a plurality of four-transistor memory cells arranged in an array, each of the memory cells comprising first and second field effect transistors respectively coupled to bit lines and controlled by word line potential, each of the memory cells further comprising third and fourth cross-coupled field effect transistors respectively coupled in series with the first and second field effect transistors and forming a circuit having two stable states; and a word line driving circuit shared by the plurality of our-transistor memory cells, the word line driving circuit reflecting a stable state potential change of each of the plurality of memory cells, and controlling a voltage on a word line extending to the plurality of memory cells in order to maintain the stable state potential in each of the plurality of memory cells.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 2 and 3.

Figure 2:
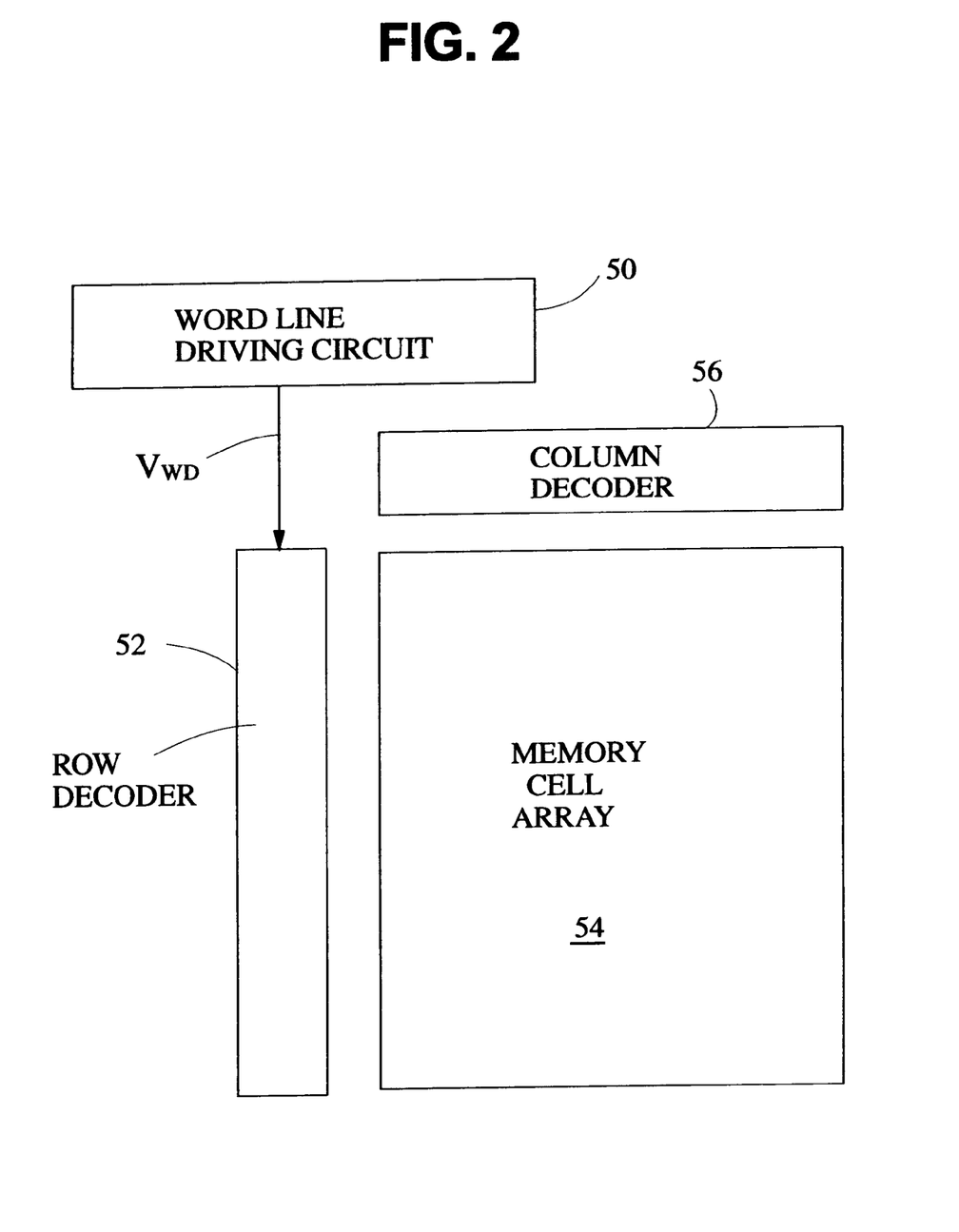
FIG. 2 is a diagram schematically showing an overall arrangement of a memory chip to which the present invention is applied.

FIG. 2 is a diagram schematically showing an overall arrangement of a memory chip to which the present invention is applied. Generally speaking, the present invention resides in a word line driving circuit 50 which outputs a word line voltage $V_{WD}$ which is applied to a plurality of memory cells iva word-enable switches provided in a row decoder 52. A memory cell array 54 consists of individual memory cells arranged in an array of horizontal rows and vertical columns. Each cell is capable of storing one bit of binary information.

As is well known in the art, each memory cell shares a common connection with the other cells in the same row, and another common connection with the other cells in the same column. To access a particular memory cell, i.e., a particular data bit in the memory cell array 54, the corresponding bit and word lines respectively extending from a column decoder 56 and the row decoder 52 must be activated (selected). Once a memory cell (or a group of memory cells) is selected in this fashion, a data read and/or data write operation may be performed on the selected single bit or multiple bits on a particular row. The column decoder 56 serves the double duties of selecting the particular column and routing the corresponding data content in a selected row to the output.

The present invention is concerned with the word line voltage control during the standby mode. Accordingly, the data writing and reading will not be given for the sake of simplifying the instant disclosure because these operations may be identical with the prior art of FIG. 1 and have been discussed in the opening paragraphs.

Figure 3:
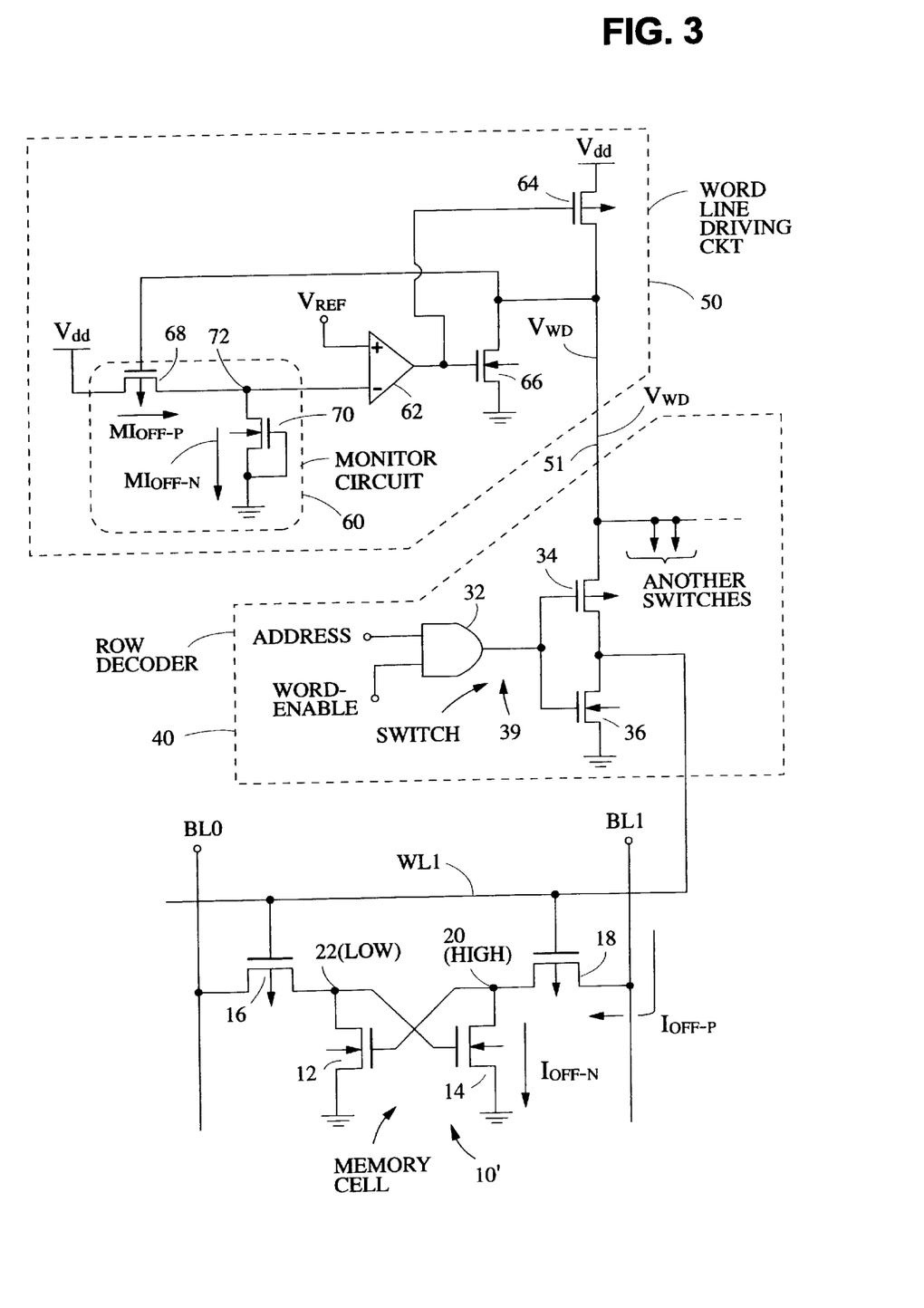
FIG. 3 is a diagram showing a first embodiment of the present invention.

Referring to FIG. 3, there is shown in detail the word line driving circuit 50 together with part of the row decoder 40, and a memory cell 10'. It is to be noted that the word line driving circuit 50 is shared by all the memory cells provided in a chip by way of switches 39 in the row decoder 40. The memory cell 10' and the switch 39 shown in FIG. 3 are substantially identical with those shown in FIG. 1. However, it is to be noted that an output line 51 of the word line driving circuit 50 extends to all the switches in the row decoder. Therefore, the components already referred to in connection with FIG. 1 are labeled same reference numerals and the descriptions thereof will be omitted for the sake of simplifying the instant disclosure except for becoming necessary in context.

As in the case described in the opening paragraphs, it is assumed that the nodes 20 and 22 exhibit respectively high and low potential. Thus, in order to maintain the high potential at the node 20, it is necessary to supply the leak current $I_{OFF-P}$ to replenish the leak current $I_{OFF-N}$.

As mentioned above, a memory chip is provided with a very large number of memory cells and as such, it is not practically possible to fabricate the transistors of all the on-chip memory cells so as to exhibit the same leak currents. As is known in the art, the threshold voltage of a MOSFET depends strongly on the gate length of the transistor. More specifically, as the channel length becomes shorter, the threshold voltage is lowered with the result of increase in the leak current. However, when the memory chip is designed, it might be possible to predict the upper and lower limits of scatter in the leak currents of the transistors of all the on-chip memory cells. The upper limit of leak current among the n-channel transistors is designated by $I_{OFF-N(MAX)}$, and the lower limit of leak current among the p-channel transistors is designated by $I_{OFF-P(MIN)}$.

The word line driving circuit 50 comprises a monitor circuit 60, a differential amplifier 62, a p-channel transistor 64, and an n-channel transistor 66. The monitor circuit 60 consists of a p-channel transistor 68 and an n-channel transistor 70, which are coupled in series as the p- and n-channel transistors in each memory cell. During the standby mode, the transistors 64 and 66 are respectively retained on and off (vis., no leak current compensation is not required), and hence, the voltage $V_{WD}$ on an output line 51 extending to the word line WL 1 is at Vdd.

Assuming that the leak currents of the transistors 68 and 70 are represented by $MI_{OFF-P}$ and $MI_{OFF-N}$. In order to successfully compensate for each of all the leak currents flowing through the cross-coupled transistors of the on-chip memory cells, the following relationships should be satisfied.

$$MI_{OFF-N} \geq I_{OFF-N(MAX)} \quad (1)$$

$$MI_{OFF-P} \geq I_{OFF-P(MIN)} \quad (2)$$

In this case, although it appears to be somewhat difficult in practice, it is preferable that $MI_{OFF-N}$ is equal to $I_{OFF-N(MAX)}$ and $MI_{OFF-P}$ is equal to $I_{OFF-P(MIN)}$.

For the convenience of description, it is assumed that the leak current $I_{OFF-N}$ of the transistor 14 is $I_{OFF-N(MAX)}$. When the leak current $I_{OFF-N}$ increases due to the rise of the ambient temperature, the current $MI_{OFF-N}$ in the monitor current 60 also increases whereby the potential at a node 72 between the drains of the transistors 68 and 70 is lowered. In the case where the potential at the node 72 is lowered below a reference voltage $V_{REF}$, the output of the differential amplifier 62 is lowered such as to render the transistor 64 partially non-conducting and the transistor 66 partially conducting. Thus, the voltage $V_{WD}$ on the output line 51 (and hence the voltage on the word line WL1) is slightly lowered and hence, the current $I_{OFF-P}$ increases in order to replenish the charge at the node 20. On the other hand, the lowering of the voltage $V_{WP}$, which is applied to the gate of the transistor 68, increases the current $MI_{OFF-P}$ flowing through the transistor 68 and accordingly, the voltage at the node 72 is raised. When this negative feedback causes the potential at the node 72 to exceed the reference voltage $V_{REF}$, the output of the differential amplifier 62 causes the voltage $V_{WD}$ to equal the power potential Vdd. When the potential at the node 72 is again lowered below the reference voltage $V_{REF}$, the above-mentioned feedback operation is iterated in order to maintain the bit information stored in the memory cell 10' by way of replenishing the high voltage at the node 20.

The reference voltage $V_{REF}$ is determined considering what voltage at the node 72 appropriately decreases the voltage $V_{WD}$ on the line 51 so as to compensate for the leak current $I_{OFF-N}$.

In the above, the word line driving circuit 50 utilizes the differential amplifier 62. However, as an alternative, a comparator may be used in place of the differential amplifier 62.

Figure 4:
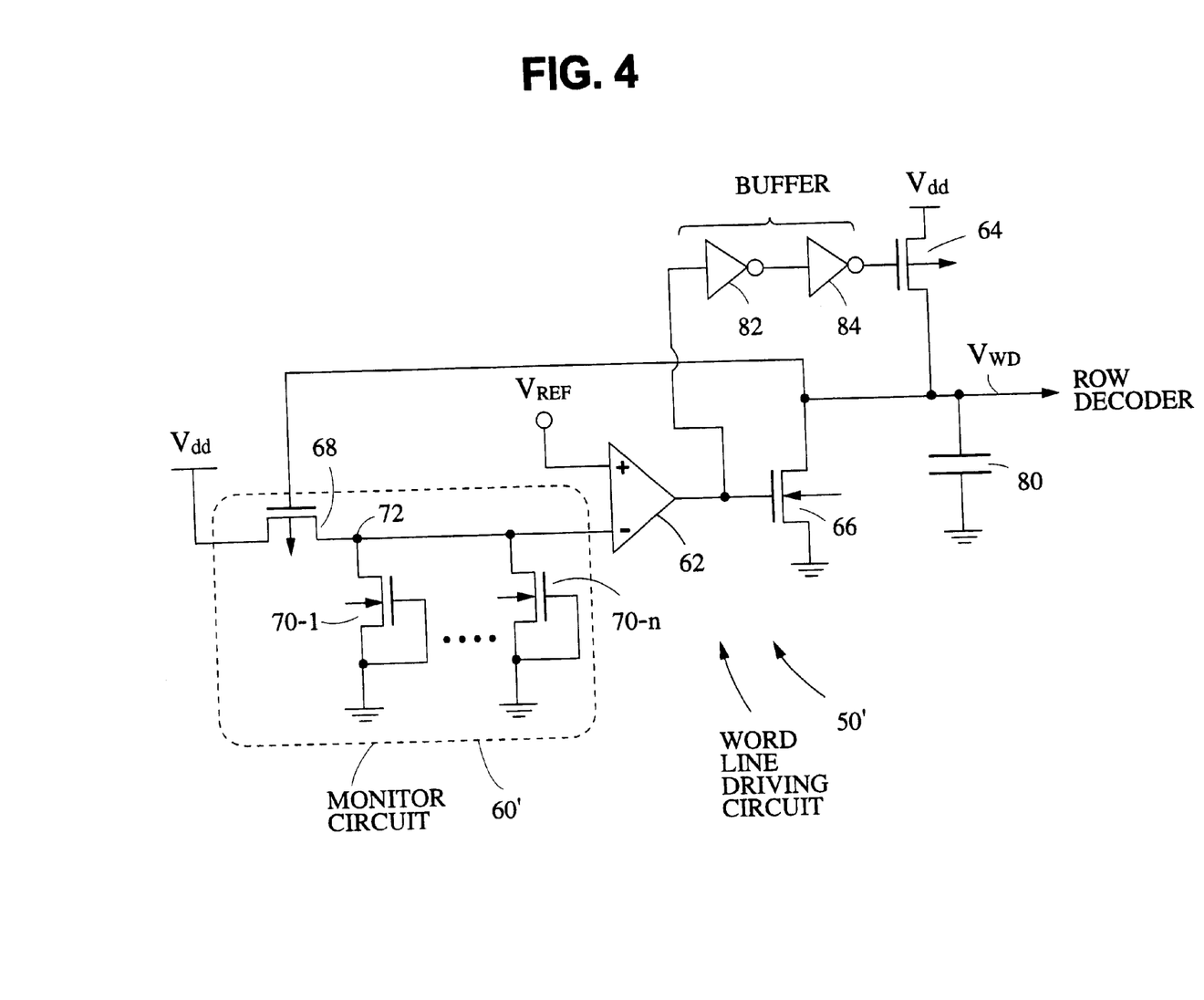
FIG. 4 is a diagram showing a second embodiment of the present invention.

Referring to FIG. 4, there is shown a word line driving circuit 50' according to a second embodiment of the present invention. The driving circuit 50' differs from the counterpart 50 shown in FIG. 3 as follows. First, a plurality of transistors 70-1 to 70-n, which are typically identical with one another, are provided in place of the single transistor 70. Second, a capacitor 80 is added between the output of the word line driving circuit 50' and ground. Third, one or more than two buffers (two are shown in this particular case which is denoted by 82 and 84) are newly provided between the gate of the transistor 64 and the output of the differential amplifier 62 in order to amplify a current applied to the gate of the transistor 64. Other than this, the word line driving circuit 50' is substantially identical with the counterpart 50 of the first embodiment.

The transistors 70-1 and 70-n are provided so as to rapidly lower the potential at the node 72 when the temperature of the memory chip changes due to the chip's ambient temperature. More specifically, it is necessary to lower the voltage at the node 72 faster than the voltage, at the high node of a memory cell, which is most rapidly lowered among all the memory cells of a chip.

The capacitor 80 is provided such as to prevent the voltage $V_{WD}$ from been temporarily lowered when a large current flows through the word line when the word line is selected.

The word line driving circuit 50' is shared by all the memory cells on the chip and this, the transistor 64 is required to flow a large current therethrough. Therefore, the transistor 64 is fabricated such that the channel length is relatively large. If the differential amplifier 62 is fabricated to rapidly bring the transistor 64 into the partial non-conducting state, the channel length of the differential amplifier 62 should also be long. In such a case, the chip area-efficiency is undesirably reduced with the result of raising fabrication cost. In order to avoid this problem, the buffers 82 and 84 are provided so as to amplify the current applied to the gate of the transistor 64.

The above mentioned three modifications of the second embodiment relative to the first embodiment can be sued independently. That is, these modifications are optional and as such, one or two thereof can be omitted depending on the actual application.

Figure 5:
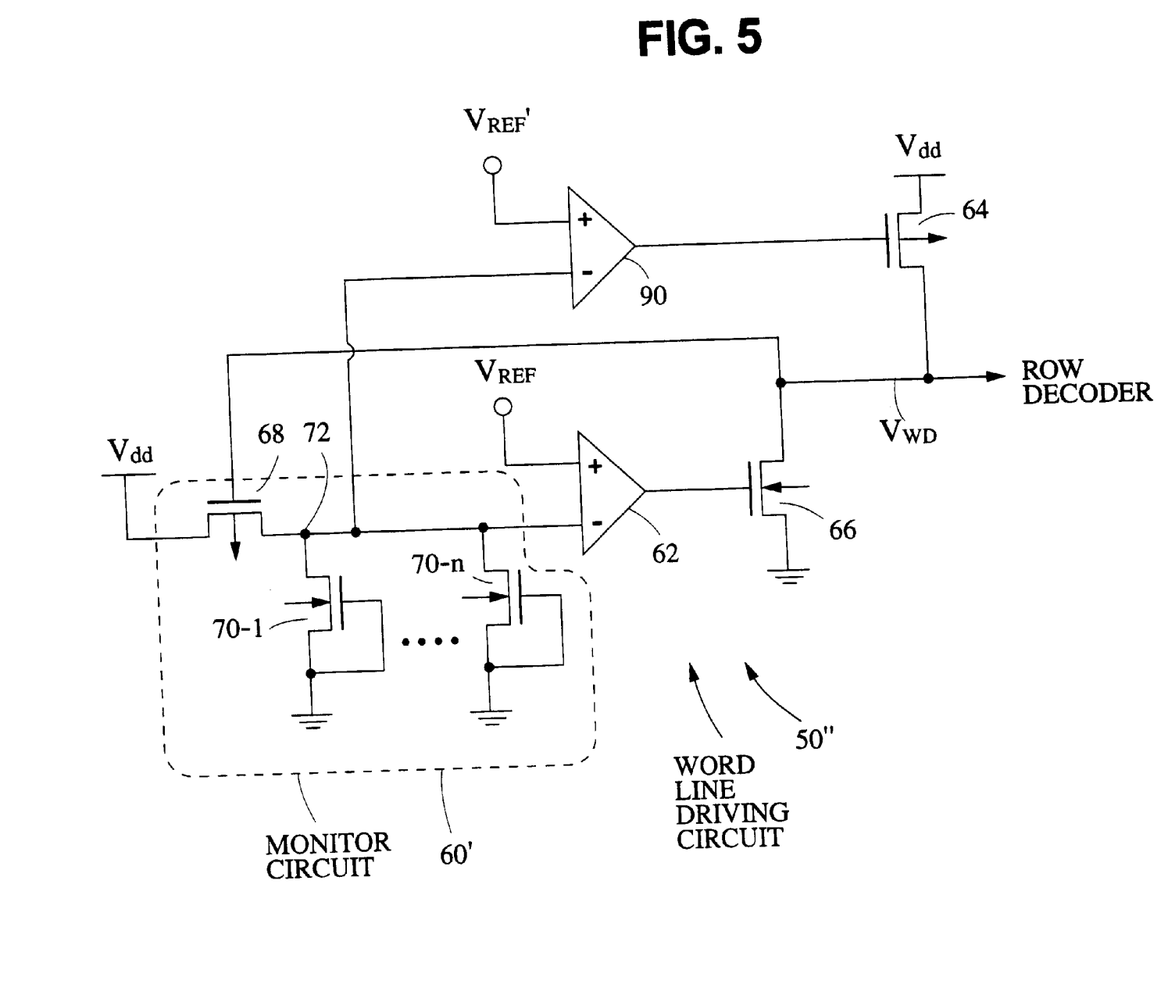
FIG. 5 is a diagram showing a third embodiment of the present invention.

Referring to FIG. 5, there is shown a word line driving circuit 50" according to a third embodiment of the present invention. The driving circuit 50" differs from the counterpart 50 shown in FIG. 3 in terms of two points. One is that a plurality of transistors 70-1 to 70-n are provided in place of the single transistor 70 as in the second embodiment. This modification has been referred to in connection with FIG. 3 and thus, further descriptions thereof will not be given. The other is that another differential amplifier 90 is added such that one input thereof is coupled to the drains of the transistor 68 and the transistors 70-1 to 70-n (vis., the node 72), and the other input thereof is supplied with another reference voltage $V_{REF}'$. This reference voltage $V_{REF}'$ is set higher than $V_{REF}$. The values of $V_{REF}$ and $V_{REF}'$ are determined as follows. That is, when the voltage at the node 72 is lowered below $V_{REF}$, the transistor 64 is in the non-conducting state and the transistor 66 becomes partially conductive thereby slightly lowering the voltage $V_{WD}$. On the other hand, when the voltage at the node 72 is between $V_{REF}$ and $V_{REF}'$, both the transistors 64 and 66 are in the non-conducting state. Further, when the voltage at the node 72 is higher than both $V_{REF}$ and $V_{REF}'$, the transistor 64 is in the partially conducting state and the transistor 66 is in the non-conducting state. Therefore, it is possible to avoid the case where both the transistors 64 and 66 are rendered conductive at the same time and the large current flows to ground by way of the transistors 64 and 66. In the above, the plurality of transistors 70-1 to 70-n may be replaced with the single transistor 70.

It will be understood that the above disclosure is representative of three possible embodiments of the present invention and that the concept on which the invention is based is not specifically limited thereto.

What is claimed is:

1. A static random access memory comprising:

a plurality of four-transistor memory cells arranged in an array, each of said memory cells comprising first and second field effect transistors respectively coupled to bit lines and controlled by a word line potential, each of said memory cells further comprising third and fourth cross-coupled field effect transistors respectively coupled in series with said first and second field effect transistor and forming a circuit having two stable states; and a word line driving circuit shared by each one of said plurality of four-transistor memory cells, said word line driving circuit reflecting a stable state potential change of each of said plurality of memory cells, and controlling an output voltage thereof which is applied to said plurality of memory cells in order to maintain the stable state potential in each of said plurality of memory cells.

2. The static random access memory as claimed in claim 1, wherein said first and second field effect transistors have a first channel type, and said third and fourth field effect transistors have a second channel type opposite to the channel type of said first and second field effect transistors.

3. A static random access memory comprising:

a plurality of four-transistor memory cells arranged in an array, each of said memory cells comprising first and second field effect transistors respectively coupled to bit lines and controlled by word line potential, each of said memory cells further comprising third and fourth cross-coupled field effect transistors respectively coupled in series with said first and second field effect transistor and forming a circuit having two stable states; and a word line driving circuit shared by said plurality of four-transistor memory cells, said word line driving circuit reflecting a stable state potential change of each of said plurality of memory cells, and controlling an output voltage thereof which is applied to said plurality of memory cells in order to maintain the stable state potential in each of said plurality of memory cells;

wherein said word line driving circuit further comprises:

a monitor circuit comprising fifth and sixth field effect transistors which have opposite channel types and are coupled in series between a power source and ground, a potential at anode between said fifth and sixth transistors varying in response to said stable state potential change; and a word line voltage controller operatively coupled to said monitor circuit and said power source, said word line voltage controller responding to said potential at said node and controlling said output voltage of said word line driving circuit.

4. The static random access memory as claimed in claim 3, wherein said word line voltage controller comprises:

first means (62) for generating a control voltage determined by said potential at said node and a reference voltage; and second means (64, 66) for controlling said output voltage of said word line driving circuit in response to said control voltage generated from said first means.

5. The static random access memory as claimed in claim 4, wherein said first means comprises a differential amplifier having a first input to which said potential at said node is applied and a second input to which said reference voltage is applied.

6. The static random access memory as claimed in claim 4, wherein said first means is a comparator having a first input to which said potential at said node is applied and a second input to which said reference voltage is applied.

7. The static random access memory as claimed in claim 4, wherein said second means comprises:

a seventh field effect transistor (64), provided in a path extending from said power source to an output line on which said output voltage of said word line driving circuit develops, for controlling said output voltage of said word line driving circuit in response to said control voltage from said first means; and an eighth field effect transistor (66), provided between said output line and ground, for controlling said output voltage of said word line driving circuit in response to said control voltage from said first means.

8. The static random access memory as claimed in claim 3, wherein a leak current of said fifth field effect transistor is smaller than a minimum leak current for use in maintaining the stable state potential among said plurality of memory cells, and wherein a leak current of said sixth field effect transistor is larger than a maximum leak current acting as reducing the stable state potential among said plurality of memory cells.

9. The static random access memory as claimed in claim 3, wherein alternatively said word line driving circuit comprises:

a monitor circuit comprising a fifth field effect transistor and a plurality of sixth field effect transistors arranged in parallel, said fifth field effect transistor having a channel type opposite of those of said plurality of sixth field effect transistors, said fifth field effect transistor being coupled in series with said plurality of sixth field effect transistors between a power source and ground, a potential at a node between said fifth field effect transistor and said plurality of sixth field effect transistors varying in response to said stable state potential change; and a word line voltage controller operatively coupled to said monitor circuit and said power source, said word line voltage controller responded to said potential at said node and controlling said output voltage of said word line driving circuit.

10. The static random access memory as claimed in claim 9, wherein said word line voltage controller comprises:

first means (62) for generating a control voltage determined by said potential at said node and a reference voltage; and second means (64, 66) for controlling said output voltage of said word line driving circuit in response to said control voltage generated from said first means.

11. The static random access memory as claimed in claim 9, wherein said first means comprises a differential amplifier having a first input to which said potential at said node is applied and a second input to which said reference voltage is applied.

12. The static random access memory as claimed in claim 9, wherein said first means is a comparator having a first input to which said potential at said node is applied and a second input to which said reference voltage is applied.

13. The static random access memory as claimed in claim 9, wherein said second means comprises:

a seventh field effect transistor (64), provided in a path extending from said power source to an output line on which said output voltage of said word line driving circuit develops, for controlling said output voltage of said word line driving circuit in response to said control voltage from said first means; and an eighth field effect transistor (66), provided between said output line and ground, for controlling said output voltage of said word line driving circuit in response to said control voltage from said first means.

14. The static random access memory as claimed in claim 9, wherein a leak current of said fifth field effect transistor is smaller than a minimum leak current for use in maintaining the stable state potential among said plurality of memory cells, and wherein a leak current of said plurality of sixth field effect transistors is larger than a maximum leak current acting as reducing the stable state potential among said plurality of memory cells.

15. The static random access memory as claimed in claim 7, further comprising a capacitor provided in parallel with said eighth field effect transistor for preventing an abrupt potential drop of said output voltage of said word line driving circuit.

16. The static random access memory as claimed in claim 7, further comprising means, provided in a path between an output of said differential amplifier and a gate of said seventh field effect transistor, for increasing a current applied to said gate of said seventh field effect transistor.

17. The static random access memory as claimed in claim 5, further comprising another differential amplifier having a first input to which said potential at said node is applied and a second input to which another reference voltage is applied, and said another reference voltage being higher than said first mentioned reference voltage.

* * * * *